(12) United States Patent
Elliott et al.

(10) Patent No.: US 6,279,088 B1
(45) Date of Patent: Aug. 21, 2001

(54) MEMORY DEVICE WITH MULTIPLE PROCESSORS HAVING PARALLEL ACCESS TO THE SAME MEMORY AREA

(75) Inventors: Duncan G. Elliott, Etobicoke; W. Martin Snelgrove, Toronto, both of (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 09/275,972

(22) Filed: Mar. 25, 1999

Related U.S. Application Data

(60) Division of application No. 08/686,504, filed on Jul. 24, 1996, now Pat. No. 5,956,274, which is a continuation-in-part of application No. 08/224,998, filed on Apr. 7, 1994, now Pat. No. 5,546,343, which is a continuation-in-part of application No. 07/599,510, filed on Oct. 18, 1990, now abandoned.

(51) Int. Cl.[7] .............................. G06F 9/28; G06F 9/345; G06F 9/302; G06F 9/308
(52) U.S. Cl. .......................................... 711/155; 365/220
(58) Field of Search ...................................... 365/154, 220; 370/395, 522; 711/155; 712/206, 215

(56) References Cited

U.S. PATENT DOCUMENTS

| | | | | |
|---|---|---|---|---|
| 4,682,167 | * | 7/1987 | Ikeda et al. | 340/825.23 |
| 5,134,614 | * | 7/1992 | Baydar et al. | 370/522 |
| 5,235,543 | * | 8/1993 | Rosen | 365/154 |
| 5,542,084 | * | 7/1996 | Lowe, Jr. | 345/501 |
| 5,687,173 | * | 11/1997 | Melden et al. | 370/395 |

\* cited by examiner

Primary Examiner—B. James Peikari
(74) Attorney, Agent, or Firm—Harold C. Baker; Robert A. Wilkes; Robert G. Hendry (57) ABSTRACT

A digital computer performs read-modify-write (RMW) processing on each bit of a row of memory in parallel, in one operation cycle, comprising: (a) addressing a memory, (b) reading each bit of a row of data from the memory in parallel, (c) performing the same computational operation on each bit of the data in parallel, using an arithmetic logic unit (ALU) in a dedicated processing element, and (d) writing the result of the operation back into the original memory location for each bit in the row.

2 Claims, 8 Drawing Sheets

MEMORY DEVICE WITH MULTIPLE PROCESSORS HAVING PARALLEL ACCESS TO THE SAME MEMORY AREA

This application is a divisional of application Ser. No. 08/686,504 filed Jul. 24, 1996 and now U.S. Pat. No. 5,956,274, which is a continuation of application Ser. No. 08/224,998, filed Apr. 7, 1997 and now U.S. Pat. No. 5,546,343 which is continuation of application Ser. No. 07/599,510 filed Oct. 18, 1990 (now abandoned).

FIELD OF THE INVENTION

This invention relates to computer structures, and in particular to a parallel processing memory chip containing single instruction, multiple data path processors.

DESCRIPTION OF THE PRIOR ART

In conventional Von Neumann computer architectures, the speed of the processor is often restricted by the bandwidth of the interconnecting data bus, which is typically 8 to 64 bits in word width. In order to increase the speed of computers restricted by such constraints, parallel computer architectures have been designed, for example, those described briefly below.

In a structure called The Connection Machine, 64K processors are used with 4K bits of memory allocated to each processor. The memory permits two read functions and a write function in one processor cycle to support three operand instructions. The Connection Machine integrated circuit chip contains 16 processors and a hypercube routing node. A high performance interconnect network is a major feature of the architecture. The peak performance of the connection machine is about 1,000 MIPS, using a 32 bit addition function as a reference. A description of The Connection Machine may be found in Scientific American article "Trends in Computers", by W. Daniel Hillis, Special Issue/Vol. 1, page 24ff.

A structure referred to as the Massively Parallel Processor (MPP) constructed by Goodyear Aerospace contains several 128×128 processor planes. The MPP was designed to process Landsat images; it makes heavy use of its two dimensional grid connectivity. Processors are packaged eight to a chip.

The ICL Distributed Array Processor was designed to be an active memory module for an ICL type 29000 mainframe. Its first implementation was a 32×32 grid built from MSI TTL components. A CMOS version has since been made containing 16 processors. Each 1 bit processor consists of a full adder, a multiplexer to select data from neighbors, and three registers.

A computer MP-1 is described by MasPar Computer Corporation in preliminary product literature, the product being formed of chips containing 32 processors which will be assembled into machines with 1K–16K processors. The machine utilizes two instruction streams. Each processing element can elect to obey either of the streams, so both halves of an if-then-else statement can be concurrently followed without nesting.

NCR Corporation has produced a chip containing 6×12 serial processors which is called the Geometric Arithmetic Parallel Processor (GAPP). Each processor can communicate with its four nearest neighbors on its two dimensional grid and with a private 128 bit memory. The processing elements operate on instructions with five fields. Due to their complexity, these processing elements take up slightly more than half the chip. It has been found that yields are low and the cost is expensive.

In an article entitled "Building a 512×512 Pixel-Planes System" in Advanced Research in FLSI—Proceedings of the 1987 Stanford Conference, pages 57–71, 1987, by John Poulton et al, a pixel planes machine is described which integrates processing elements with memory. The machine was designed for computer graphics rendering. The pixel planes machine is connected to a host processor via a DMA channel. It is noted that for many operations, data transfer between the host and pixel planes machine dominate the execution time.

SUMMARY OF THE INVENTION

In the aforenoted structures, while each uses plural processors, separate memory is accessed by the processors. Locating memory on different chips than the processor elements limits the degree of integration. The data path between the memory chips and the processors limits the bandwidth available at the sense amplifiers. In contrast, in an embodiment of the present invention, one processing element per sense amplifier can be achieved, the processing elements carrying out the same instruction on all bits of a memory row in parallel. Therefore an entire memory row (e.g. word) at a time can be read and processed in a minimum time, maximizing the parallel processing throughput to virtually the maximum bandwidth capacity of the memory.

While in prior art structures an entire memory row is addressed during each operation, typically only one bit at a time is operated on. The present invention exploits the unused memory bandwidth by operating on all bits in the entire row in parallel. Further, the memory is the same memory accessed by the main computer processor, and not special memory used for the parallel processing elements as in the prior art.

By locating the processors on the same chip as the memory, the present invention exploits the extremely wide data path and high data bandwidth available at the sense amplifiers.

In one embodiment of the present invention, integrated into the memory chip is one processing element per sense amplifier. The memory is preferred to be the main computer memory, accessible by the central processing unit.

Alternatively, each processor element can be connected to more than one sense amplifier. When sense amplifiers belong to different arrays (or "cores") of memory, some of those cores need not perform a memory cycle, thereby reducing sensing power draw from a power supply.

In the prior art each parallel processor has its own memory, and the processors must communicate with each other, slowing down communication and being limited by inter-processor bus word length. In the present invention the main memory is used directly and may be accessed by a conventional single microprocessor at the same rate as conventional memories. Yet virtually the maximum bandwidth of the memory can be utilized using the parallel on-chip processing elements.

It should be noted that in the aforenoted NCR GAPP device, processors are located on the same chip as the memory. However because of the size of the processors, each processor communicates with 8 sense amplifiers, and requires extensive multiplexing. This slows the chip down because the maximum bandwidth of the memory cannot be utilized. In order to minimize the number of sense amplifiers dealt with by a single processor, the structure is limited to use with static memory cells, since the static memory cells are considerably wider in pitch than dynamic memory cells. Still, a very large number of sense amplifiers must be multiplexed to each processor element. Due to the smaller sense amplifier pitch required in a prior art DRAM chip, processors have not been put into a DRAM chip.

The present invention utilizes an unique form of processing element, based on a dynamic multiplexer, which we have found can be made substantially narrower in pitch than previous processing elements, such that the number of sense amplifiers per processing element can be reduced to 1, for static random access memories, and to 4 or fewer for dynamic random access memories. For the 1:1 ratio no multiplexing is required, and therefore in 1 memory cycle, with a single instruction given to all the processing element, all the bits of a row can be read, processed and written back to memory in parallel. For the larger ratio multiplexing is required of processing elements to sense amplifiers, but for the first time dynamic random access memories can have processing elements on the same chip, and can have a substantially increased number of parallel processing elements. For the dynamic memory, a typical ratio of processing elements to sense amplifiers would be 8:1 or 4:1, although as close to 1:1 as possible is preferred. The bandwidth of the processor to memory interface is thereby substantially increased, enormously increasing the processing speed.

Further, the invention allows direct memory access of the same memory having the on-chip processors by a remote processor. This renders the memory to be even more versatile, allowing flexibility in programming and applications.

In accordance with another embodiment of the invention, a novel simultaneous bidirectional buffer is described, which can logically connect two buses and actively drive the signal in either direction, either into or out from each processing element without prior knowledge of which direction the signal must be driven. Previously, bidirectional bus drivers utilized transmission gates or pass transistors, or bidirectional drivers which amplify but must be signalled to drive in one direction or the other.

As a result, the present invention provides a memory bandwidth or data rate which is several orders of magnitude higher than the bandwidth available with off-chip processing elements and prior art parallel processing designs. This is obtained in the present invention by connecting an on-chip processing element to each sense amplifier of a static random access memory, or to a very few of a dynamic random access memory. Each time the number of sense amplifiers per processing element doubles, the performance is halved. Wider processing elements are achieved to the detriment of speed. For this reason it is preferred that the number of sense amplifiers connected to each processing element should be no greater than four. Nevertheless it is preferred that there should be an equal number of processing elements, e.g. 1, for each sense amplifier (memory bit line). The processing elements thus each process a word 1 bit wide.

A novel processing element has been realized using a dynamic logic multiplexer for performing arithmetic and logical (ALU) operations, which results in a physically narrow processor element design. In an embodiment of the present invention the ALU instruction is multiplexed through the address pins in the memory. This considerably reduces the number of pins required per chip. In addition, one or a multiple of columns can be selected for read, write or communication with separate control of address lines and their compliments.

Due to system power constraints and integrated circuit pin current constraints, high density dynamic random access memories (DRAMs), for example in excess of 256Kb, typically use only half or fewer of the sense amplifiers per memory cycle. It is desirable in an embodiment of the present invention to have all processing elements active in each cycle. In one embodiment of the present invention, half of the sense amplifiers and half of the memory element arrays can be active during each cycle, and the processing elements communicate with either of two adjacent memory arrays. Only one of those two memory element arrays have their bit lines precharged or have a word line asserted.

In an embodiment of the present invention two processing elements are stacked to permit plural ones per memory array, permitting use of wider processing elements.

In another embodiment a processing element can be connected to more than one memory array permitting some memory arrays to be inactive during a given processor/memory cycle, thus offering potential saving of power.

In summary, an embodiment of the invention is a random access memory chip comprised of static random access storage elements, word lines and bit lines being connected to the storage elements, a sense amplifier connected to corresponding bit lines, a separate processor element connected to each of the sense amplifiers, apparatus for addressing a word line, and apparatus for applying a single instruction to the processor elements, whereby the instructed processor elements are enabled to carry out a processing instruction in parallel on separate bits stored in the storage elements of the address word line.

Another embodiment of the invention is a random access memory comprising dynamic random access storage elements, word lines and bit lines connected to the storage elements, a sense amplifier connected to corresponding bit lines, plural processor elements each connected to plural sense amplifiers for processing bits sensed by all of the bit lines, apparatus for addressing a word line, and apparatus for applying a single instruction to each of the processor elements, whereby the instructed processor elements are enabled to carry out a processing instruction in parallel on separate bits stored in the storage elements of the addressed word line.

According to another embodiment of the invention, a method of operating a digital computer is comprised of the steps of, in one operation cycle addressing a memory, reading a row of data from the memory in parallel, and performing the same computational operation function on each bit of the data in parallel to provide a result.

BRIEF INTRODUCTION TO THE DRAWINGS

A better understanding of the invention will be understood with reference to the description below and to the attached drawings, in which.

DETAILED DESCRIPTION OF EMBODIMENTS OF THE INVENTION

Figure 1:
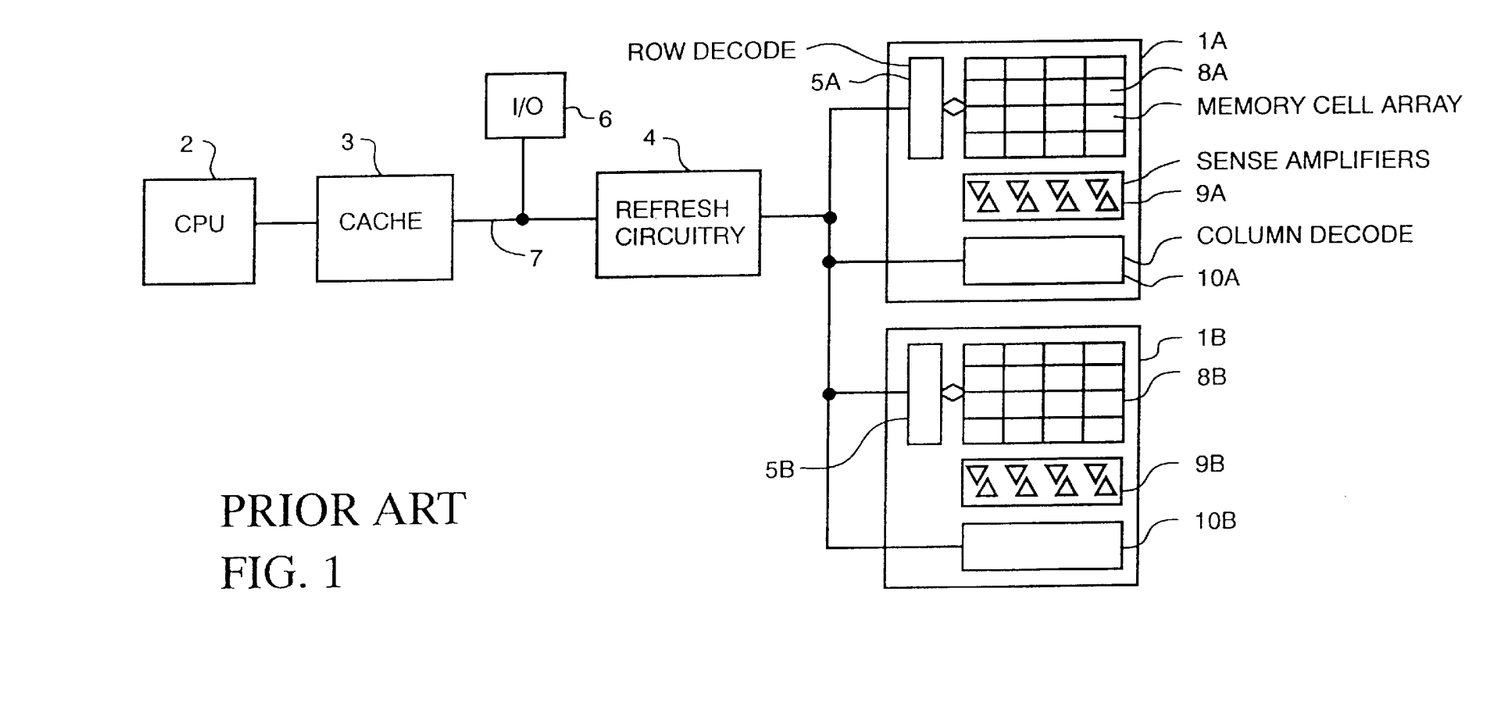
FIG. 1 is a block schematic of a typical prior art computer memory, and its connection to a central processing unit.

Turning to FIG. 1, a memory comprised of memory portions (chips) 1A and 1B is shown. A central processing unit 2 is connected to a cache memory 3, which is connected to refresh circuitry 4, which is connected to memory address and row decode circuitry 5A and 5B. The computer input/output (I/O) circuit 6 is connected to the address and data bus 7 which is connected to cache 3. Each of the representative memory portions 1A and 1B is comprised of row decode circuitry 5A, 5B, a memory cell array 8A, 8B, sense amplifiers 9A, 9B connected to each column of memory cells, and column decode circuitry 10A, 10B.

In operation, CPU 2 addresses a row and column of a memory cell array in a well known manner, and applies a read enable or write enable signal to the decode circuitry which either reads or stores a bit in a memory cell via the sense amplifiers.

A representative CMOS memory cell is illustrated in FIG. B11 of Microcomputer Primer by Mitchell Waite and Michael Pardee, Howard W. Sams & Co. Inc., Copyright 1976. While that storage cell is a six transistor storage cell, a single MOS storage element with capacitor storage cell is shown in FIG. B13. Descriptions of operation of the aforenoted storage cells are found on pages 204–207 of the aforenoted publication; such memory cells are well known to those skilled in the art and therefore will not be repeated here. The column, bit or data lines are commonly illustrated as vertical lines, to which the sense amplifiers are connected and the word or row lines are commonly shown as horizontal lines. Operation of read/write memories of various types is described in appendix B, page 199ff of the aforenoted publication, and need not be described further herein.

Figure 2:
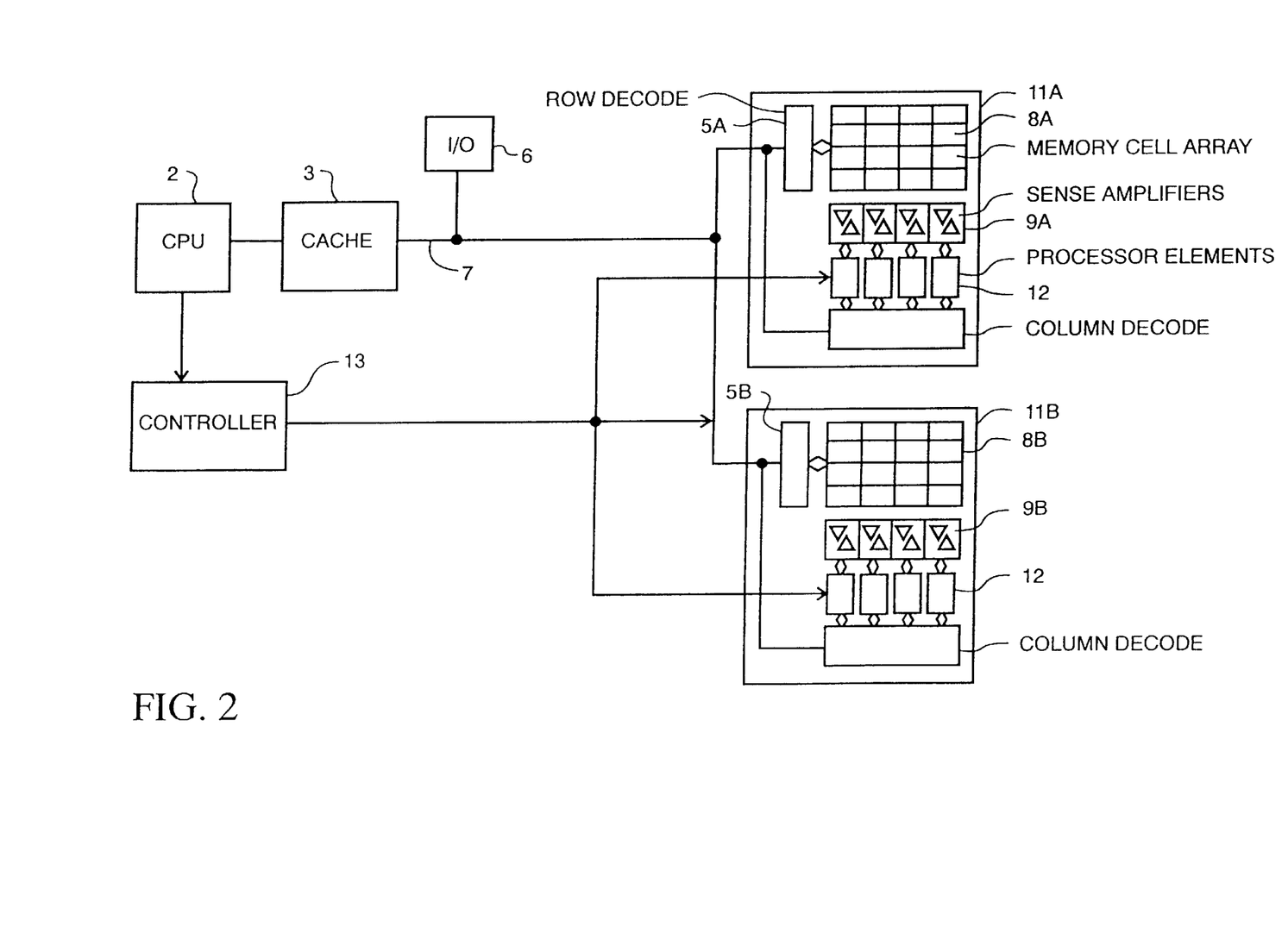
FIG. 2 is a block schematic of the memory of the present invention, and its connection to a central processing unit.

FIG. 2 is a block diagram of an embodiment of the present invention. While in the prior art of FIG. 1 the sense amplifiers interface bit lines of the memory cell array and the column decode circuitry, in the memory 11A, 11B of the present invention, separate processor elements interface each sense amplifier and the column decode circuitry in the case of static random access memory cells, or up to four sense amplifiers in the case of dynamic random access memory cells. A processor controller 13 provides instructions to the processor elements. The row decode circuitry 5A, 5B is connected to the memory cell array 8A, 8B as described earlier, and the sense amplifiers 9A, 9B interface the column lines of the memory cell array 8A, 8B. The interface of the processor elements will be described in more detail below. CPU 2 is connected to a cache memory 3, which is connected to bus 7 as before, and the bus 7 is connected to the row and column (bit) decode circuitry 5A.

The memory cell array 8A is preferred to be shared between the CPU 2 and the processor elements 12. The CPU 2 provides an instruction to controller 13, which sends the instruction to all of the processor elements 12, in one embodiment. If all of the processor elements have been selected by means of the address sent from CPU2 to the decode circuitry, the processor elements process the instruction in parallel, using the different data bits stored in the single row that has been designated by the row decode address sent from CPU 2 to the memory. In other words, a single row of bits is selected, and all of those bits are sensed in parallel in sense amplifiers 9A, and are processed in processor elements 12 in parallel. The processor elements 12 can then store the result of the process instruction back into the same memory elements as provided the sensed bits, all in one cycle.

Since the memory 11A, 11B is computer main memory, a conventional CPU 2 can simply read and write the contents of and to the memory. To perform a parallel routine, the CPU copies an instruction into a control store (not separately shown) of the controller 13 (which could be microcoded) which issues the instruction stream to the processor elements.

The memory cells could be either static or dynamic memory, and are not restricted to any particular form of semiconductor element.

Figure 3:
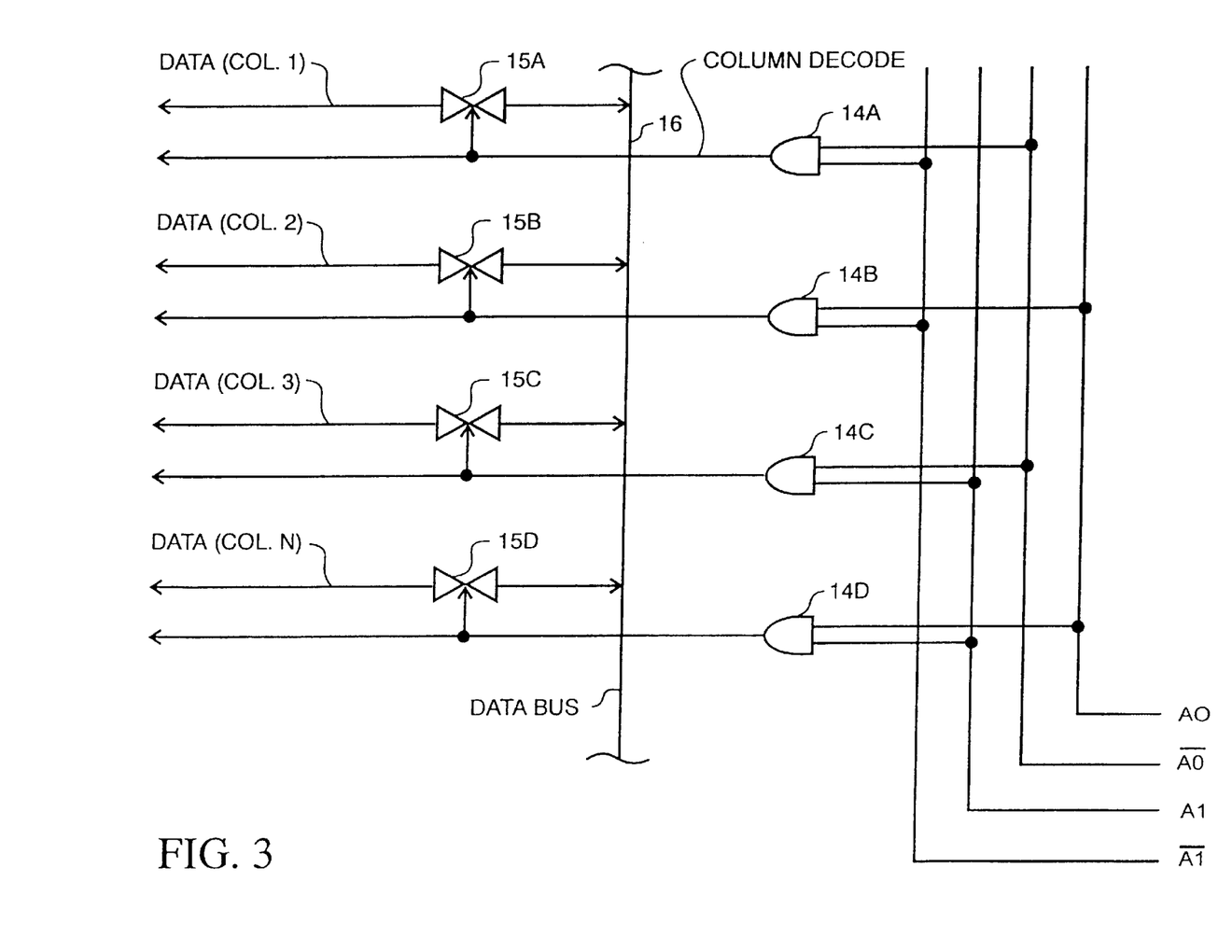
FIG. 3 is a simplified logic diagram of decoding circuitry for bit lines and which can be used for word lines if the bidirectional buffers are deleted.

FIG. 3 illustrates an embodiment of column decode circuit, a form of which can be used for row (word) decode. The address lines $A0$, $\overline{A0}$, $A1$, $\overline{A1}$ are connected to AND gates, 14A, 14B, 14C, 14D, or the equivalent each of which has its output connected to the enable input of a corresponding bidirectional driver 15A–15B. A bidirectional circuit through each driver is connected from an internal data bus 16 to a corresponding processor element, as will be described with reference to FIG. 4. The outputs of the AND gates 14A–14D are also connected to corresponding processor elements as will be described.

There will be as many AND gates as there are processor elements, and the small number of gates and address lines shown is illustrated merely for the sake of a relatively simple example.

Figure 4:
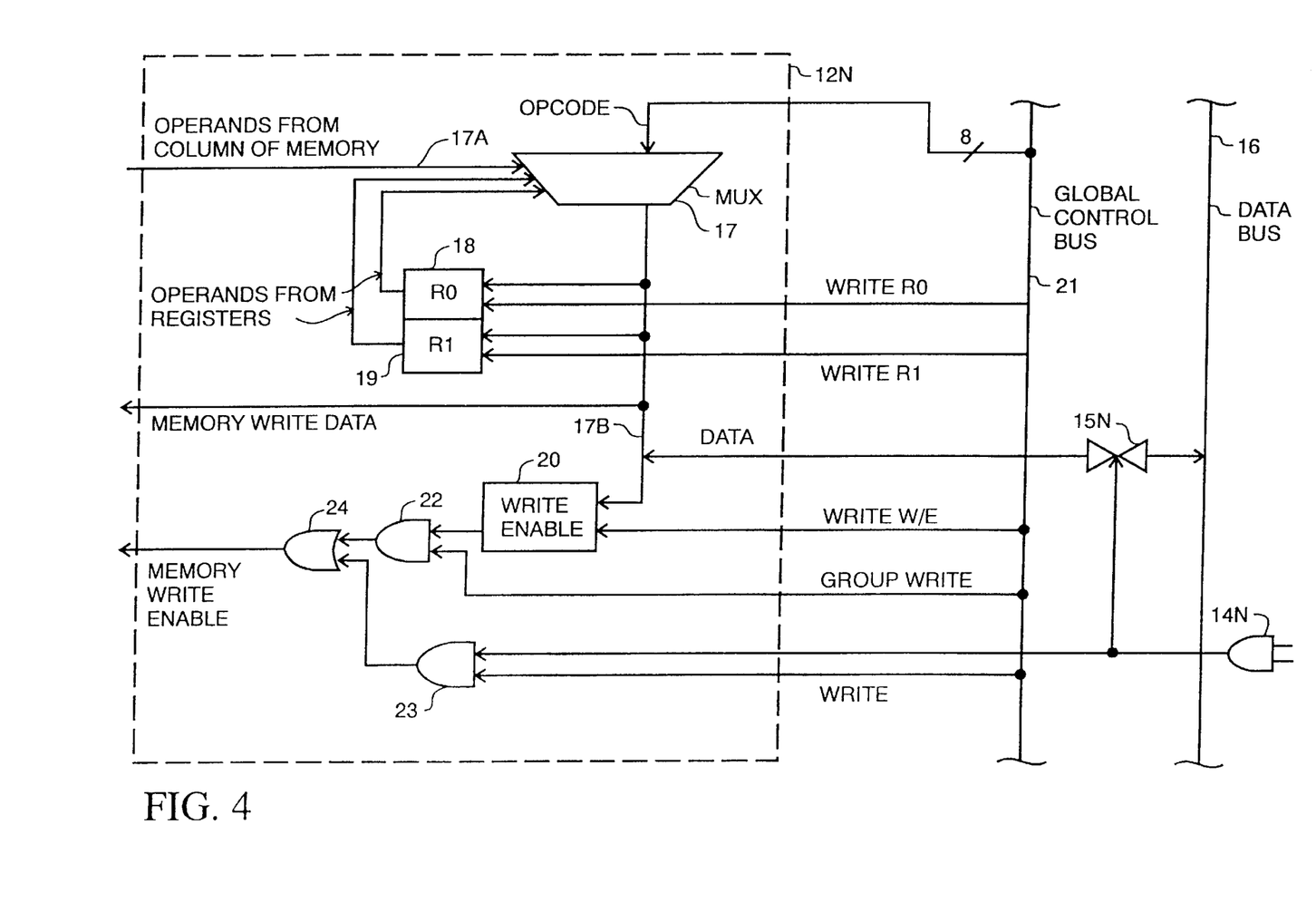
FIG. 4 is a logic diagram of an embodiment of a processing element.

FIG. 4 illustrates in dashed line a representative 1 bit processor element 12N. Within each element is an arithmetic logic unit (ALU), in the form of a dynamic logic multiplexer 17. The output bus of the multiplexer 17 is connected to the inputs of one bit wide registers R0 18 and R1 19 as well as to an input of memory write enable logic 20 and to the bit write line of an associated sense amplifier.

The output of a sense amplifier connected to a column (bit) line of the memory cell array is connected as an operand input 17A to multiplexer 17. The outputs of registers 18 and 19 are also connected to inputs of multiplexer 17. Multiplexer 17 also has a control input connected to receive operational instruction inputs on e.g. an 8 bit wide bus from global control bus 21.

It was noted in the description with respect to FIG. 3 that bidirectional drivers are enabled from an address bus. As shown in FIG. 4 representative bidirectional driver 15N has its enable input connected to the output of representative AND gate 14N, which has its input connected to the address bus described earlier with respect to FIG. 3. The bidirectional circuit through the bidirectional driver 15N is connected from data bus 16 to the output bus 17B of multiplexer 17, from which the data can be applied to registers 18 and/or 19, or to the memory write bit data line for writing to a column of the memory cell array to enable a remote processor to have access to the memory.

The write W/E input of write enable logic 20 is connected to the global control bus 21. A group write lead from global control bus 21 is connected to an input of AND gate 22, with the output of write enable logic 20. The output of AND gate 14N is connected to an input of AND gate 23 which has its other input connected to a write lead of global control bus 21. The outputs of AND gates 22 and 23 are connected to OR gate 24. The output of OR gate 24 is connected to the memory write enable input of the memory cell array.

In operation, (neglecting precharge) a single instruction from controller 13 (FIG. 2) comprised of addresses for the row and column decoders operation code for the ALU (multiplexer 17), and data bits is applied to the memory. The address is applied to the row (word) decoder in a well known manner. The operation code, however, is applied to the global control bus 21, and is received by all of the multiplexers 17 in parallel. Data is applied to the data bus 16 and 1 bit per processor element is transferred through the bidirectional driver, upon decoding of the column (bit) decode, and is applied via the bus 17B to the memory write data line corresponding to the particular column associated with the respective processing element. With a group write signal from global control bus 21 going high, and data appearing on the data bus 16, the write enable logic 20 is caused to apply a high level signal to AND gate 22 which transfers the data to an input of OR gate 24. This causes a memory write enable signal to appear at its output, causing the data applied to the memory write data line (after passing through the associated sense amplifier), to be written to the memory element corresponding to the bit line and decoded row address. As a result data has been written to the memory in one cycle.

In a corresponding manner, an operand from a column (bit line) of memory is applied to an input 17A of multiplexer 17. An operation instruction from global control 21 with data applied to register 18 and/or 19 and the data read from the memory bit line is carried out on the input data to the multiplexer 17.

Figure 5:
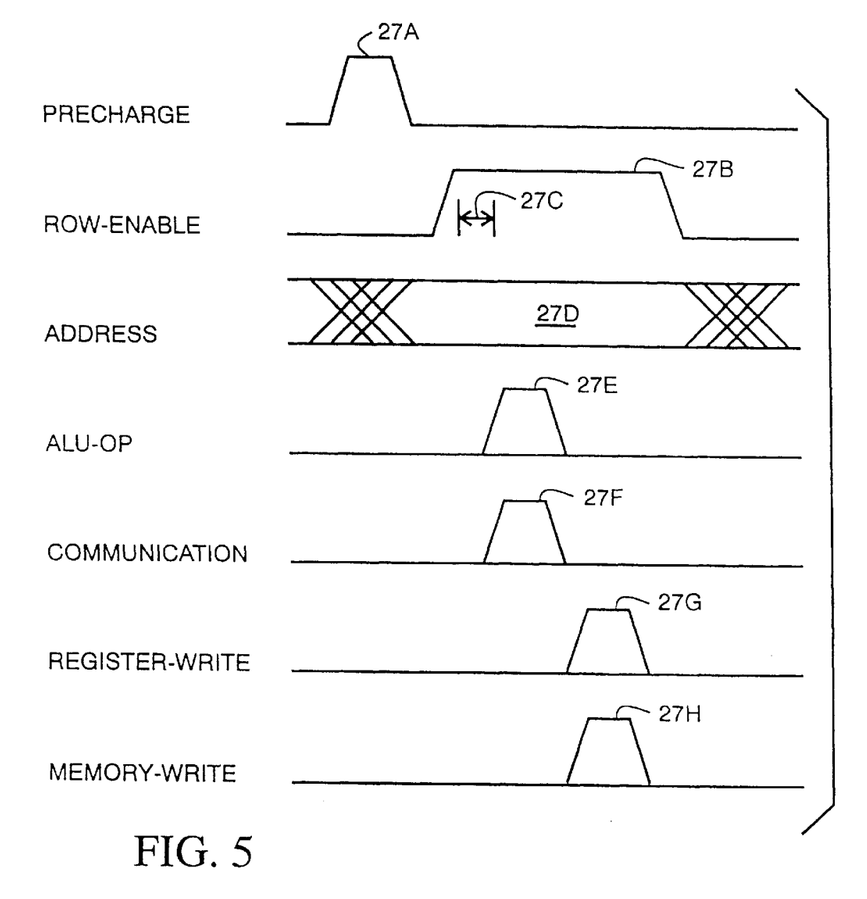
FIG. 5 is a timing diagram used to explain operation of the present invention.

Below will be given an example of an arithmetic operation for an embodiment that uses an 8K bit static RAM. However before doing so, consider FIG. 5 which illustrates timing of the memory chip. The first function is to precharge the bit lines and the result lines of the memory over a first interval 27A in a well known manner. A row address is applied from the row decode circuitry 5A, also in a well known manner, over the interval 27B, resulting in reading of a row of bits occurring over the interval 27C. The processor element (i.e. the column) is addressed as is described above with respect to FIG. 3 over the uncrosshatched interval shown in FIG. 5 as 27D. The operation code is applied from global control bus 21 to multiplexer 17 during the interval 27E. Communication between the output bus 17B of multiplexer 17 and data bus 16 via bidirectional buffer 15N occurs over interval 27F which is coincident with interval 27E. The registers 18 and 19, and the corresponding memory cell which is located at the intersection of the column corresponding to the processor element and the enabled (or addressed) row are written over the coincident intervals 27G and 27H respectively. The result of the asserted operation code is written to the memory as specified by write register R0, write-RWE, group write and write signals.

For a memory read, the ALU opp code for the structure shown in FIG. 4 is set to "result=memory" and the selected column is gated onto the bus 16, whereby the data is then sent off-chip. The ALU opp code is set to "result=1" for a write so that the data on the bus can potentially pull the result line low (0 dominates over 1 in the dynamic logic used). The result line is then written out to the memory. For transfers, the sender places a value in register R0 while the receiver stores a 1. Feeding the ALU, the opp code "result=R0" while selecting the columns of both leaves the value on the result line of both processing elements. This can be written to memory by the receiver. All or a subset of the processors can be queried if a match has been found in a search or if a solution has been found using a non-deterministic algorithm. In this case true is encoded as a zero so that any processing element may pull the "open source" bus low once the result is gated to the bus. The size of the population of responding processing elements can also be determined with a simple algorithm.

Consider now the performance of an ALU function to receive the variable A from the memory, to add it to the variable B, and to replace the result back in the same memory cell as A was received.

First, the variable B is placed in the register R0 from the global control bus 21. Next the least significant bit of the variable A received from the memory is Exclusive Or'd and the result is logically ANDed with the content of register R0 in the multiplexer 17, and is placed in register R1.

The content of register R1 is then Exclusive Or'd with variable B in multiplexer 17 and the result is placed in register R0, while the content of register R1 is logically ANDed with variable B in multiplexer 17 and the result is placed in register R1.

The variable A is logically Exclusive Or'd with the content of register R0, and the result replaces variable A. That value is logically ANDed with the content of register R0, and the result logically Or'd with the content of register R1 and the result is placed in register 1.

The above is expressed in boolean algebraic terms below.

A=A plus B

Legend: $R_0$=register 0, used here for half adder result
    $R_1$=register 1, used here for carry
    $A_0$=the least significant bit of variable A
    $\oplus$ logical Exclusive Or
    · logical And
    + logical Or
    operations on the same line are performed concurrently

ORDER OF OPERATIONS $R_0=B_0$
$A_0=A_0 \oplus R_0$  $R_1=A_0 \cdot R_0$
$R_0=R_1 \oplus B_i$  $R_1=R_1 \cdot B_i$
$A_i=A_i \oplus R_0$  $R_1=R_1+(A_i \cdot R_0)$ The last two lines are repeated for the desired word size.

A truth table with the separate code bits applied to the multiplexer in the right-hand column reflecting the operation of $A_i \oplus R_0$ (mem$\oplus$R) follows.

| Mem | $R_0$ | $R_1$ | Opcode Bits |
|---|---|---|---|
| 0 | 0 | 0 | 0 |
| 0 | 0 | 1 | 0 |
| 0 | 1 | 0 | 1 |
| 0 | 1 | 1 | 1 |
| 1 | 0 | 0 | 1 |
| 1 | 0 | 1 | 1 |
| 1 | 1 | 0 | 0 |
| 1 | 1 | 1 | 0 |

Figure 6:
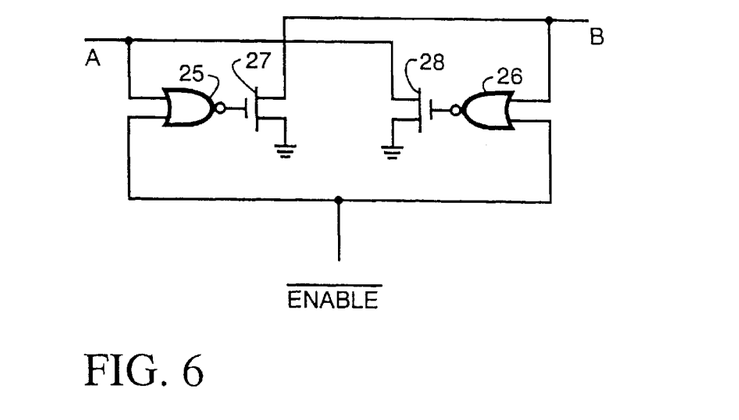
FIG. 6 is a logic diagram of a bidirectional buffer.

FIG. 6 illustrates a logic diagram of a bidirectional buffer that can be used to logically connect two buses and actively drive a signal in either direction, e.g between the bus 17B and the data bus 16. This circuit is used to drive the signal either into the processor element or out of the processor element, depending on the level of signals, without predetermining which direction the signal must be driven. In the circuit shown, a zero value can be propagated in either direction from input A to B or from B to A, and can be used with bus lines brought to a default state using precharging or passive pull-up resistors. The buffer illustrated in FIG. 6 can be implemented in MOS or CMOS for example.

The circuit is formed of NOR gates 25 and 26 each having its output connected to the enable input of a corresponding semiconductor switch 27 and 28. In the present example, each switch is illustrated as an MOS transistor having a gate (enable input) source and drain. The drain of transistor 27 is connected to one input of NOR gate 26 and to input/output B. The drain of transistor 28 is connected to one input of NOR gate 25, and to input/output A. The sources of transistors 27 and 28 are connected to ground. The second inputs of NOR gates 25 and 26 are connected to a driver $\overline{\text{ENABLE}}$ input. Assume now, that a precharge enable signal, a 0, is to be propagated from B to A. If B is brought low and assuming that an $\overline{\text{ENABLE}}$ is presented (e.g. from the column decode circuitry connected to the address bus), which appears on the second input of NOR gate 26, a zero appears at the input of NOR gate 26. As a result transistor 28 is turned on, which pulls down its drain to ground. Accordingly, a zero is propagated from B to A. In a similar manner a zero can be propagated from A to B.

Using the bidirectional buffer just described, each processor element can receive data bits from and transmit data bits to the data bus 16.

Figure 7:
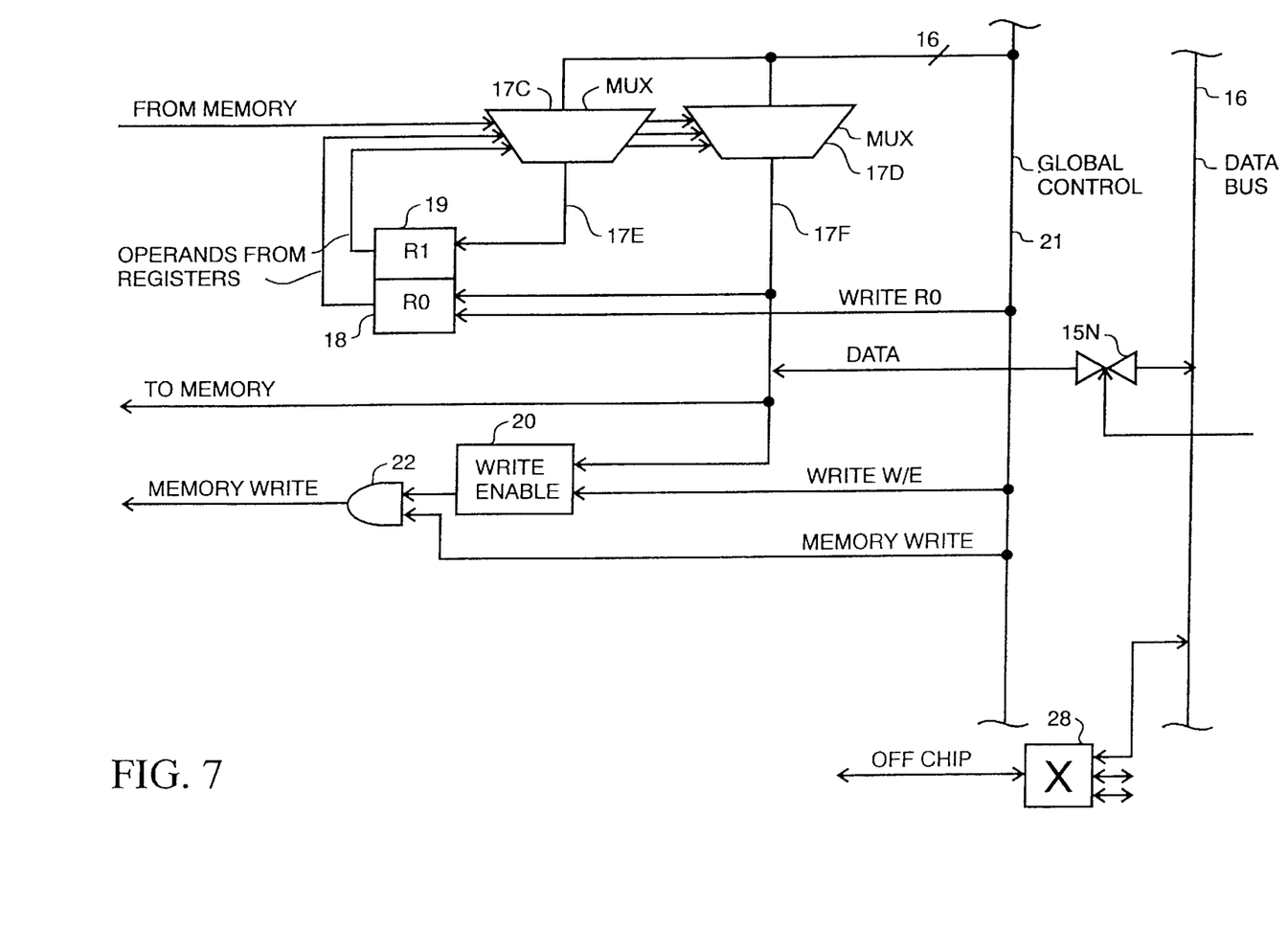
FIG. 7 is a logic diagram of another embodiment of a processing element.

Another form of processor element is shown in FIG. 7. In this case, dynamic logic multiplexers 17C and 17D are connected via two 8 bit segments of a 16 bit bus to the global control bus 21. The output bus 17E of multiplexer 17C is connected to the input of register R1 19. The output bus 17F of multiplexer 17D is connected to the input of register R0 18. A write R0 lead is connected from the global control bus 21 to an enable input of register R0 18.

The output bus of multiplexer 17D is connected to the memory bit line sense amplifier as in FIG. 4, and also to an input of write enable logic 20, which has another input connected to global control bus 21. The output of write enable logic 20 is connected to the input of AND gate 22, which has its other input connected to a memory write enable lead which is connected to global control bus 21. Data is buffered to and from the bus 17F via bidirectional buffer 15N, which is enabled as described earlier.

Operation code is received from global control 21 by the multiplexers 17C and 17D. Multiplexer 17C can communicate directly with register R1 19 rather than by placing the result on its output bus and requiring a write enable signal from the global control bus 21, as in the embodiment of FIG. 4. The memory is written to, and data is transmitted from and to the processor element in a manner similar to that described with reference to FIG. 4. However the global control bus is wider in this case, which eliminates the requirement for the addressing of the memory write enable from the address bus. The structure of FIG. 7 is thus faster than the structure of FIG. 4. A memory to memory integer addition in the structure of FIG. 7 takes only two cycles per bit, as described in the addition example noted above.

It is preferred that the memory structure should have a mechanism such that any faulty column can be disabled and that its function replaced by a spare column elsewhere in the same array. The resulting redundancy increases the yield of good memory devices.

Since the processor elements are connected to the memory columns (sense amplifier and bit lines), for flexibility, they are most easily made single bit-serial. A single bit wide design maintains the size as minimal, and maintains the cycle time short. A single address architecture was chosen so that a processor cycle could occur every memory cycle (without dual ported memories or pipelining). The single address is particularly suited to DRAM which does a read and write in each memory cycle.

It is preferred that the ALU should be implemented as an 8-to-1 dynamic logic multiplexer (in the circuit illustrated in FIG. 4) with the memory and register contents as select inputs. The result from the multiplexer is the evaluation of one of 256 arbitrary functions of three inputs. The result can be sent to the internal data bus segment, taken from the bus, or wire-ANDed with the contents of the bus. Next the result can be optionally written back to the memory, or to either of the two registers.

The write-enable (WE) register controls whether group-writes are acted on. A zero in this register effectively halts the processing element so that the single instruction path, multiple data path processor equivalent of conditional branches can be performed.

In the processing element design described with reference to FIG. 7, two 8-to-1 multiplexers are illustrated, and two output results. Each multiplexer can generate all 256 boolean functions of the three inputs to each, the input from the memory, and the outputs of registers 18 and 19. It can perform addition on a pair of arbitrary size integers using the minimum number of memory cycles possible.

In order to connect data bus 16 to other similar chips, a multiple input switch 28 can be used. The switch connects to plural data bus segments, the bus segments being brought together at switch 28. For is example, 64 processor elements can be connected to a single bus segment, and plural bus segments can be connected together via switch 28.

Preferably the processing elements should not make the memory array physically any wider than a conventional random access memory. In a successful laboratory prototype, the processing elements were each narrower than a column of random access memory cells, and were padded out to be the same width. However in some cases the processing elements may not be able to be made sufficiently narrow, and alternative structures are described below with reference to FIGS. 8A–8D.

Figure 8A:
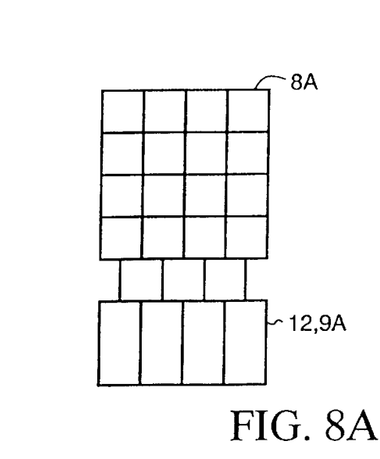
FIGS. 8A, 8B, 8C and 8D and FIG. 9 are block diagrams illustrating various configurations of memory and processing elements.

FIG. 8A illustrates the locations of the processing elements 12 and sense amplifiers 9A, relative to each column of the memory cell array 8A, where there is a correspondence of one processing element per column, at one end of the memory cell array 8A.

Figure 8B:
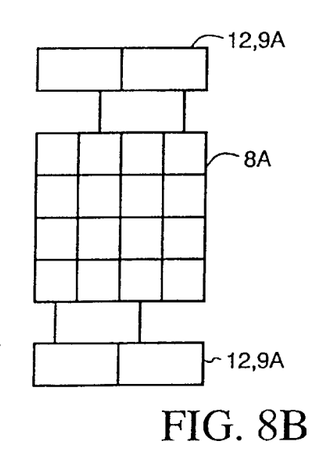

FIG. 8B illustrates a structure by which physically wider processing elements and sense amplifiers can be accommodated by placing half on each opposite end of the array, connected to odd and even bit lines respectively. Clearly, wider processing elements can be accommodated within the profile of the memory.

Figure 8C:
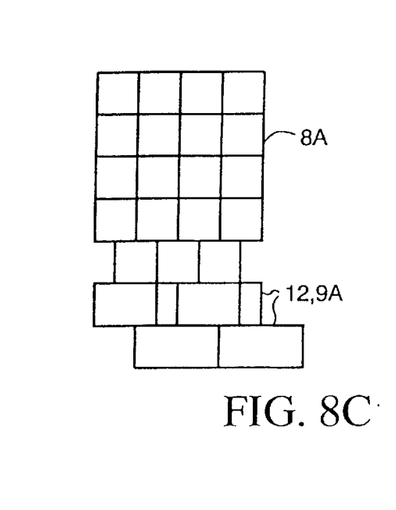

FIG. 8C illustrates stacked processing elements and sense amplifiers on one side of the memory array, accommodating wider processing elements, the full complement being only slightly wider than the memory width. The processing elements could alternatively be distributed throughout the memory, but this, and the stacked structure of FIG. 8C, is less preferred.

Figure 8D:
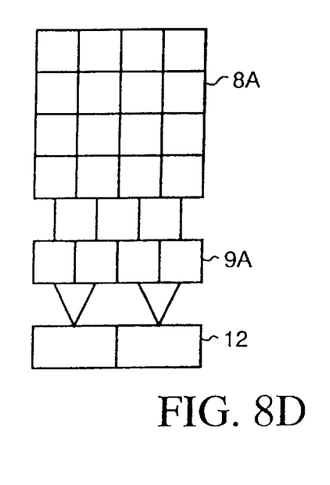

In FIG. 8D there are fewer wide processing elements which are multiplexed, for example, one processing element being multiplexed (time shared) between two or more sense amplifiers.

Figure 9:
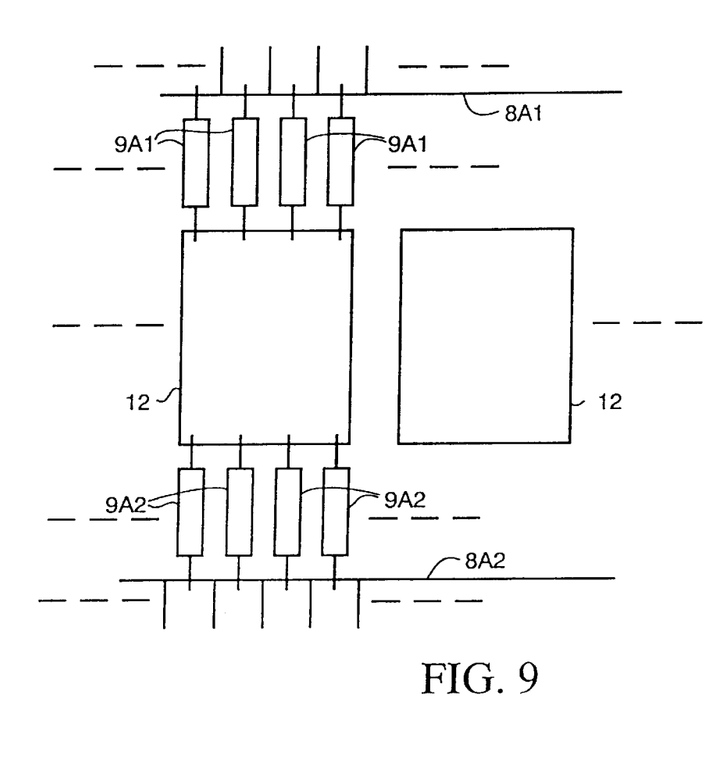

FIG. 9 illustrates an arrangement on a chip of processing elements 12 located between and communicating with two memory arrays 8A1 and 8A2 through groups of sense amplifiers 9A1 and 9A2. In the embodiment illustrated each processing element is connected to and is time shared among four sense amplifiers connected to one memory array 8A1 and four sense amplifiers connected to a second memory array 8A2. Each sense amplifier is connected to an associated memory column. This arrangement allows the pitch of the processing elements to be larger.

This structure, using one processor element to service plural sense amplifiers and connected to only one memory array corresponds to the structural concept illustrated in FIG. 8D.

In the structure of FIG. 9, the memory cycles for each memory array can be made to be sequential. This can save power, allowing the power supply to be designed to provide less power than would be the case if the memory cycles were simultaneous. This advantage can be obtained in the case the pitch of the processing elements is less, and the number of sense amplifiers per processing element is fewer, e.g. even one sense amplifier per processing element to each of the two adjacent memory arrays. In the latter case each processing element time shares between single columns in each of the two memory arrays.

Thus each processing element operates on one-half of each memory core (above or below it) at a time. One-half of each memory core is turned on in each cycle, making the use of the processor elements efficient. In contrast, in the prior art, two memory portions were used for each memory array, one being shut off at a time in order to save power supply requirements. Since only one or two bits were required at a time, only one memory portion (core) would be necessary to be turned on at one time. In contrast, in the present invention for a 512 column per core memory, each core can be split into two arrays, located on opposite sides of a row of 256 processors. In a two-core architecture, the size of the memory can be 1 megabit (2 cores each being split into two arrays of 256K bits), using 512 processors, in the example given of 1 processor per column per core. The row address determines which half of the core is to be turned on at a time.

Figure 10:
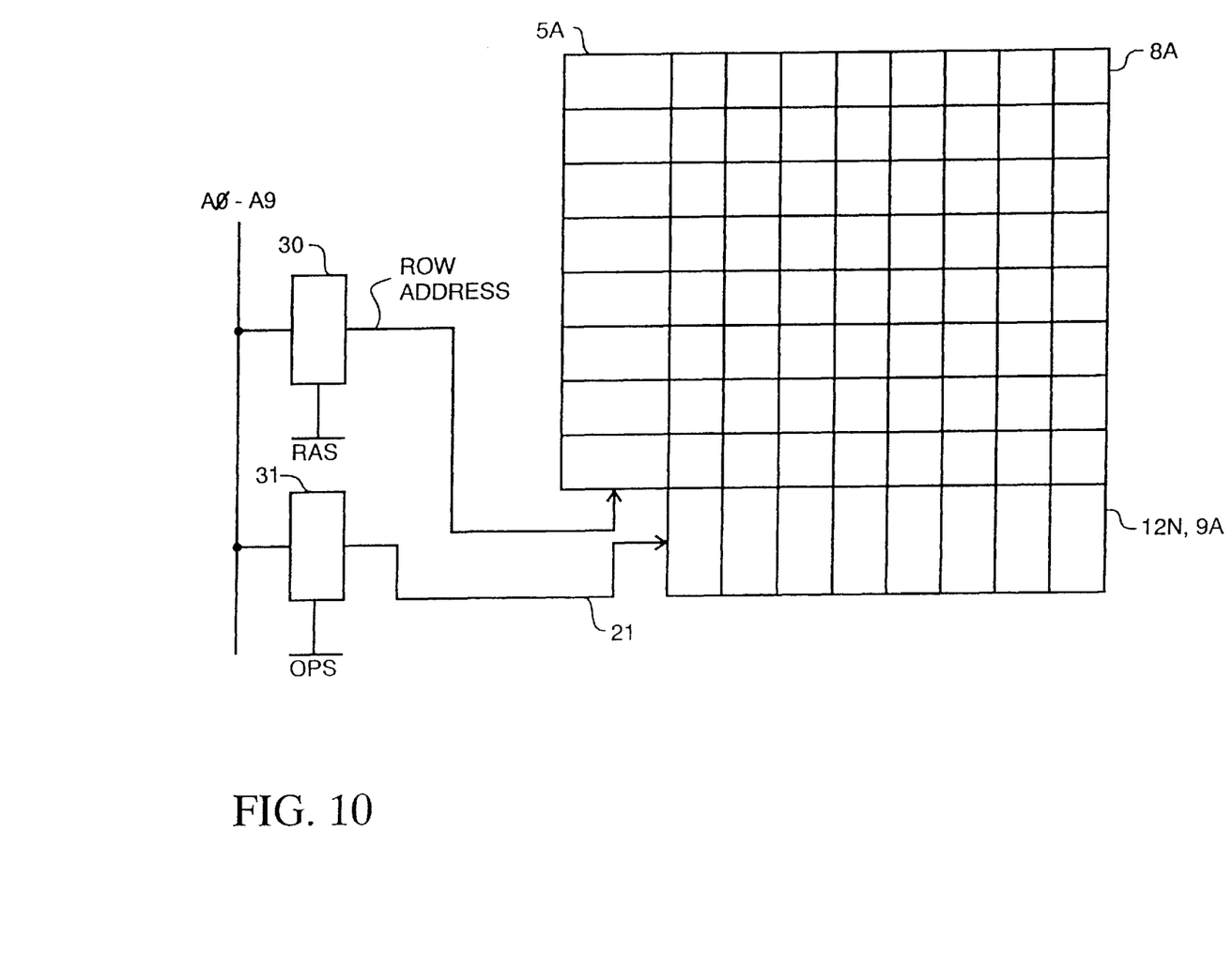
FIG. 10 is a partly block schematic and partly logic diagram illustrating how the processing elements, bit and word lines may be addressed.

The structure of FIG. 3, while noted for use as column decode, can alternatively be used as a row address with the global control bus addressing the processing elements. This is illustrated schematically in FIG. 10. Shown in FIG. 10 is a memory cell array 8A with processing element and sense amplifiers 12N, 9A connected to the columns (bit lines), and row decode circuitry 5A connected to the rows. The off-chip address pins A0–A9 (referred to earlier) are connected to row address latch 30 and processing element latch 31.

The address signals applied to pins A0–A9 are received by latches 30–31, which are also enabled at appropriate intervals under control of the CPU 2 on their $\overline{RAS}$ and $\overline{OPS}$ enabling inputs respectively. In this manner the row, and the processing elements corresponding to the columns can be addressed, and the complete row of memory cells processed in parallel by the group of processing elements addressed.

A computer containing the memory structure described above can be used for many kinds of applications, such as solving two dimensional partial differential equations, weather predictions, and computation of fluid dynamics, as an associated memory for database applications, some non-deterministic algorithms and Monte Carlo simulations. Memory using dynamic memory cells can perform error correction of a memory content as the memory is refreshed. If the cells are designed with smaller capacitors, or to store more than one bit per cell, the cost of the processing elements may be offset. The structure could be programmed to virtually test itself, which provides a substantial reduction in cost of integrated circuit manufacture. Scavenging of garbage bits could be speeded, by parallel operation of the memory. Clearing or updating the memory such as address spaces, arrays or page tables is speeded. Memory to memory copy could make certain operations such as a UNIX fork, faster.

For those applications which can exploit massive parallelism, the present invention offers processing power comparable to the fastest machines that currently exist, with a very low cost/performance ratio. In a laboratory prototype of an 8,192 bit memory, the addition of the processing elements increased chip area by only 10%. A work station equipped with 32 one megabyte memory chips of the kind described herein can for example contain 512K processors, and it is estimated can perform 7.5 trillion three-input boolean operations per second, or 58 billion 32-bit integer additions per s second, although floating point multiplication would be slower. Double precision IEEE floating point multiplications is estimated to take 3,121 cycles for an aggregate rate of 1.2 gigaflops. As a comparison, a Motorola MC88100 chip operating at 20 megahertz can perform the multiplication in only nine cycles, and accept a new operation into the pipeline every four cycles, but provides a throughput of only five megaflops.

The present invention, by operating multiple processors connected to multiple bit lines, substantially expand the bandwidth of the memory, thus realizing an enormous increase in speed.

A person understanding this invention may now conceive of alternative structures and embodiments or variations of the above. All which fall within the scope of the claims appended hereto are considered to be part of the present invention.

What is claimed is:

1. A method of operating a digital computer comprising:
   in one operation cycle:
   (a) addressing a memory,
   (b) reading each bit of a row of data from the memory in parallel,
   (c) performing the same computational operation function on each bit of the data in parallel to provide a result, and
   (d) in the same operation cycle performing the additional step of writing said result in the memory at the same address from which the row of data was read.

2. A method as defined in claim 1, and in the same operation performing the additional step of communicating said result to a data bus.

* * * * *

UNITED STATES PATENT AND TRADEMARK OFFICE
CERTIFICATE OF CORRECTION

PATENT NO. : 6,279,088 B1  
APPLICATION NO. : 09/275972  
DATED : August 21, 2001  
INVENTOR(S) : Duncan G. Elliott et al.

It is certified that error appears in the above-identified patent and that said Letters Patent is hereby corrected as shown below:

Title Page, item [60], lines 2-3, delete "continuation-in-part" and replace with --continuation--; line 4, delete "continuation-in-part" and replace with --continuation--.

Signed and Sealed this

Sixth Day of July, 2010

David J. Kappos
*Director of the United States Patent and Trademark Office*